United States Patent
Kobayashi et al.

(10) Patent No.: US 6,876,014 B2
(45) Date of Patent: Apr. 5, 2005

(54) INTERCONNECTION STRUCTURE OF A SEMICONDUCTOR DEVICE

(75) Inventors: Kazuhito Kobayashi, Chigasaki (JP); Yuzo Fukuzaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/186,173

(22) Filed: Jun. 28, 2002

(65) Prior Publication Data

US 2003/0094632 A1 May 22, 2003

(30) Foreign Application Priority Data

Jun. 29, 2001 (JP) ........................................ 2001-200016

(51) Int. Cl.$^7$ .............................................. H01L 27/10
(52) U.S. Cl. ...................... 257/202; 257/206; 257/210; 257/211; 257/774; 257/907; 257/908
(58) Field of Search ................................ 257/202, 206, 257/210, 211, 774, 907, 908, 296, 300, 301, 776, 905, 906; 438/128, 129

(56) References Cited

U.S. PATENT DOCUMENTS 5,837,577 A * 11/1998 Cherng ........................ 438/253
6,214,662 B1 * 4/2001 Sung et al. .................. 438/241
6,255,160 B1 * 7/2001 Huang ......................... 438/253
6,353,269 B1 * 3/2002 Huang ......................... 257/296

FOREIGN PATENT DOCUMENTS

| JP | 6-338597 | 12/1994 |
| JP | 8-153859 | 6/1996 |
| JP | 2000-501886 | 2/2000 |

* cited by examiner

Primary Examiner—Minhloan Tran
Assistant Examiner—Tan Tran
(74) Attorney, Agent, or Firm—Hogan & Hartson, LLP

(57) ABSTRACT

Concave portions and convex portions are formed on an insulating layer. First bit lines are arranged on the convex portions. A width of the first bit lines is set to L, and a space between the first bit lines is set to L+2S. Each of the first bit lines is electrically connected to a drain diffusion layer by a contact plug. Second bit lines are arranged in a trench between the first bit lines. A width of the second bit lines is set to L, and a space between the first and second bit lines is equal to a width S of a side wall. Each of the second bit lines is electrically connected to a drain diffusion layer by a contact plug.

17 Claims, 10 Drawing Sheets

INTERCONNECTION STRUCTURE OF A SEMICONDUCTOR DEVICE

CROSS-REFERENCE TO RELATED APPLICATIONS

This application is based upon and claims the benefit of priority from the prior Japanese Patent Application No. 2001-200016, filed Jun. 29, 2001, the entire contents of which are incorporated herein by reference.

BACKGROUND OF THE INVENTION

1. Field of the Invention

The present invention relates to an interconnection structure of a semiconductor device, and in particular, to an interconnection structure, which is used for an interconnection layer having a line and space repeated pattern, such as a bit line and a word line of a semiconductor memory.

2. Description of the Related Art

The market of a DRAM (Dynamic Random Access Memory) used as a large capacity memory remarkably changes, and a miniaturization of the semiconductor device (or design rule) is carried out as the cost saving course to follow the above changes.

In recent years, the remarkable development has been achieved in the miniaturization of the semiconductor device; for example, the miniaturization of a capacitor, an interconnection space and an interconnection width (or gate length) has been greatly advanced.

However, a problem arises in the miniaturization of the semiconductor device. For example, the interconnection space becomes narrow, and thereby, an interconnection capacitance increases. On the other hand, the interconnection width is reduced, and thereby, an interconnection resistance increases. As a result, a problem arises such that an operating speed of memory becomes slow.

The following is a description of a device structure of the conventional semiconductor device; in this case, a DRAM is given as the example.

FIG. 1 is a top plan view showing a cell array section of the DRAM. FIG. 2 is a cross-sectional view taken along a line II—II of FIG. 1, and FIG. 3 is a cross-sectional view taken along a line III—III of FIG. 1.

In this conventional example, a memory cell array comprises array-like arranged plural trench capacitor type memory cells.

In a semiconductor substrate 100, a trench capacitor 101 is formed therein. The internal structure of the semiconductor substrate 100 and the structure of the trench capacitor 101 are not so important here; therefore, the details are omitted.

A surface region of the semiconductor substrate 100 is formed with a cell transistor. The cell transistor is composed of a source diffusion layer 103, a drain diffusion layer 104 and gate electrodes 106a and 106b. The source diffusion layer 103 is electrically connected to the trench capacitor 101. On the other hand, the drain diffusion layer 104 is connected to a bit line 110 via a contact plug 109.

A gate-insulating layer 105 is interposed between the gate electrodes 106a, 106b and the semiconductor substrate 100. The gate electrodes 106a and 106b comprises laminated first polysilicon layer 106a and second polysilicon layer 106b, respectively. Further, the gate electrodes 106a and 106b are covered with a silicon nitride layer 107.

An insulating layer 108 is formed on the cell transistor so as to fully cover the cell transistor. The surface of the insulating layer 108 is planarized. The insulating layer 108 is formed with a contact hole, which reaches the drain diffusion layer 104 of the cell transistor. The above contact plug 109 is arranged in the contact hold thus formed. Further, the contact plug 109 is made of conductive polysilicon, tungsten and the like.

A plurality of bit lines 101 extending to a column direction is formed on the insulating layer 108. The plurality of bit lines 110 is regularly laid out with a line and space pattern.

In the semiconductor device having the above device structure, the plurality of bit lines 110 has the line and space pattern; therefore, it is easy to become an object for determining the minimum size on chip layout. More specifically, a width L and a space S of the bit line 110 are set to the minimum size determined by lithography technology. Moreover, in order to make large a process margin of the bit line 110, a ratio of the width L and the space S of the bit line 110 is set to 1:1.

However, as described above, in the case where the width L and the space S (line and space) of the bit line 110 are reduced, the interconnection resistance and the interconnection capacitance increase; as a result, a problem arises such that the operating speed of memory becomes late.

Recently, an approach from a material aspect has been proposed as one course for improving the operating speed of memory. For example, the following improvement courses are taken. That is, the insulating layer arranged between interconnection lines is made of an organic-based insulating material having a low permittivity so that the interconnection capacitance can be made small. Moreover, the interconnection line is made of a low resistance material (e.g., copper) so that the interconnection resistance can be made small.

However, in the case where the above improvement course from the material aspect is taken, from the reason why the price of the material itself is expensive, a manufacturing cost of semiconductor memory increases. For this reason, eventually, it is impossible to sufficiently reduce a bit cost (manufacturing cost per bit) by the miniaturization of the semiconductor device.

Moreover, as one course for reducing the interconnection resistance, a course is taken such that a thickness of the interconnection layer is made large so as to prevent a reduction of the interconnection cross-sectional area by the reduction of the interconnection width. However, when the thickness of the interconnection layer is made large, this is a factor of increasing an area where adjacent interconnection lines face each other, and increasing the interconnection capacitance; for this reason, it is impossible to sufficiently improve the operating speed of memory.

BRIEF SUMMARY OF THE INVENTION (1) According to a first aspect of the invention, there is provided a semiconductor device comprising:

an insulating layer having a surface shape comprising a concave portion and a convex portion;

a first interconnection line arranged on the convex portion of the insulating layer;

a side wall arranged on a side face of the first interconnection line and on a side face of the concave portion of the insulating layer; and a second interconnection line arranged in the concave portion of the insulating layer, and contacting with the side wall.

Further, according to a second aspect of the invention, there is provided a semiconductor device comprising:

an insulating layer;

a first interconnection line arranged on the insulating layer;

a side wall arranged on a side face of the first interconnection line; and a second interconnection line arranged on the insulating layer, and contacting with the side wall.

(2) According to another (a third) aspect of the invention, there is provided a manufacturing method of a semiconductor device comprising the following steps of:

forming a first conductive layer on an insulating layer;

etching the first conductive layer using a mask so that a first interconnection line can be formed;

etching the insulating layer using the mask so that a concave portion can be formed in the insulating layer;

forming a side wall on a side face of the first interconnection line and on a side face of the concave portion of the insulating layer;

filling a second conductive layer in the concave portion of the insulating layer; and removing a part of the second conductive layer so that a second interconnection line contacting with the side wall can be formed in the concave portion of the insulating layer.

DETAILED DESCRIPTION OF THE INVENTION

A semiconductor device according to one embodiment of the present invention and a manufacturing method of the same will be described below with reference to the accompanying drawings.

[Device Structure]

Figure 4:
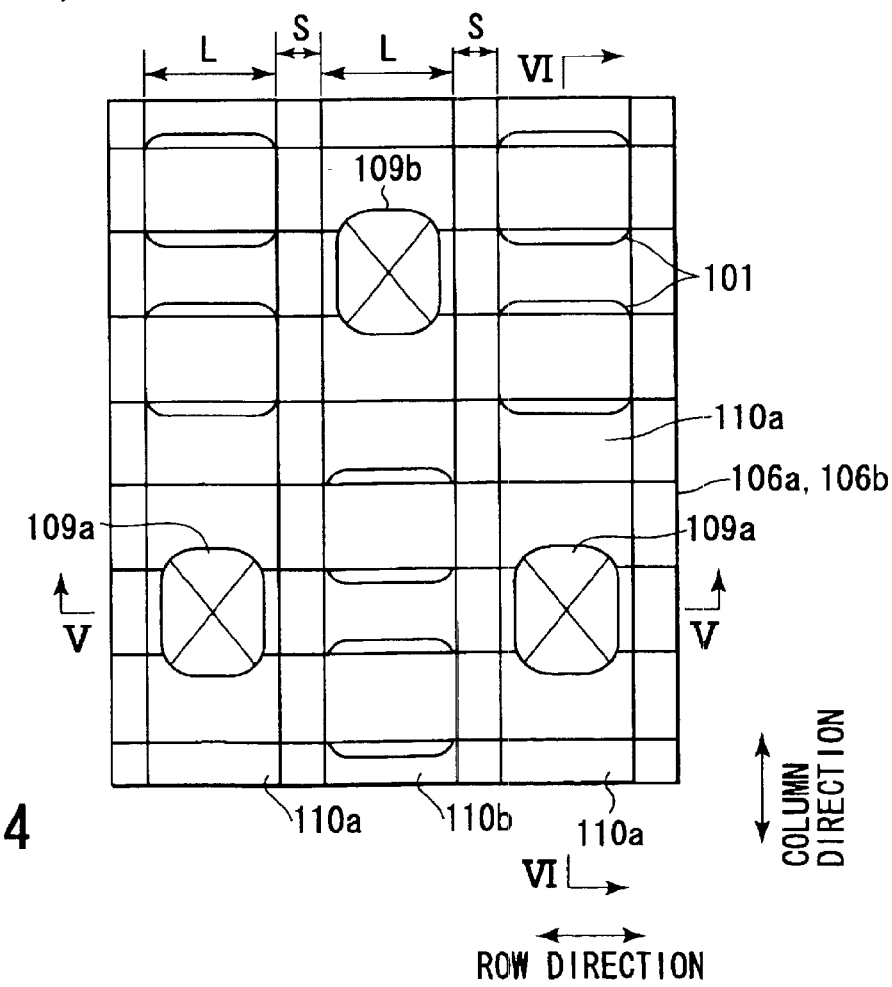
FIG. 4 is a top plan view showing a cell array section of a DRAM according to one embodiment of the present invention.
Figure 5:
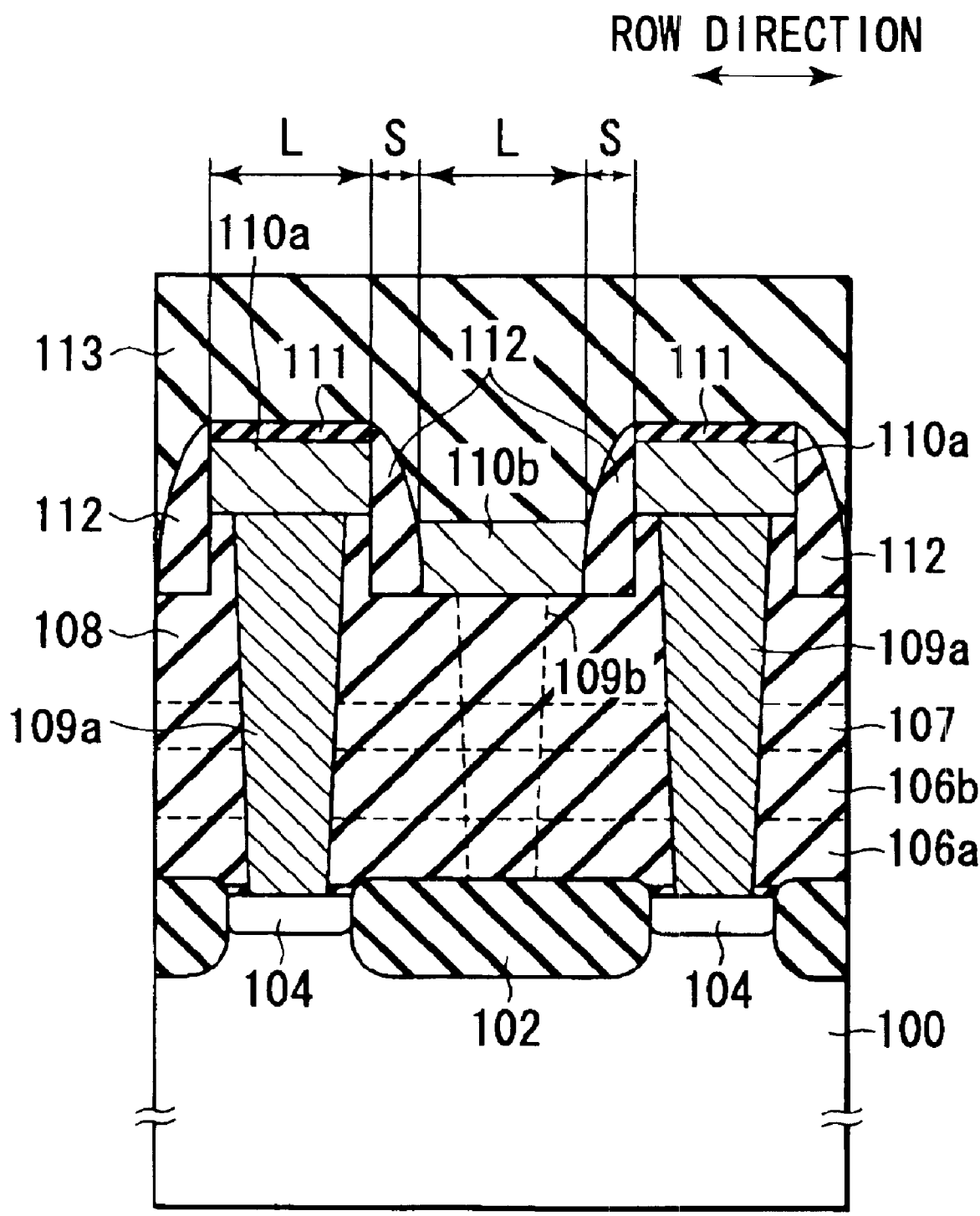
FIG. 5 is a cross-sectional view taken along a line V—V of FIG. 4.
Figure 6:
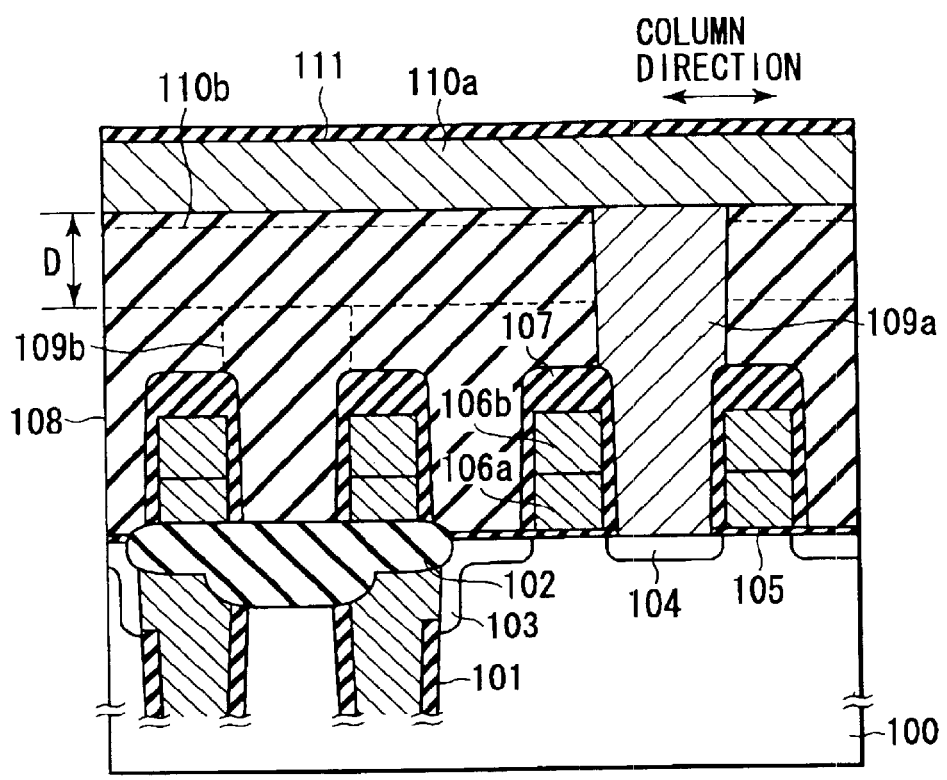
FIG. 6 is a cross-sectional view taken along a line VI—VI of FIG. 4.

FIG. 4 is a top plan view showing a cell array section of a DRAM according to one embodiment of the present invention. FIG. 5 is a cross-sectional view taken along a line V—V of FIG. 4, and FIG. 6 is a cross-sectional view taken along a line VI—VI of FIG. 4.

Figure 1:
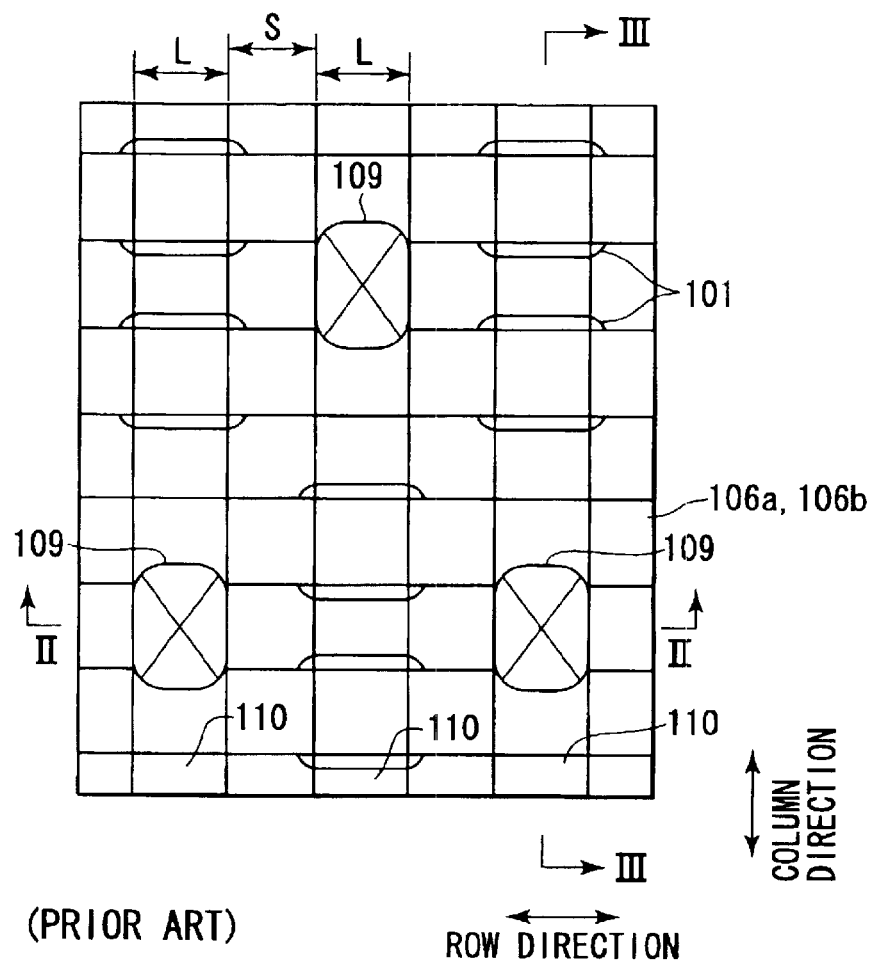
FIG. 1 is a top plan view showing a cell array section of a conventional DRAM.
Figure 2:
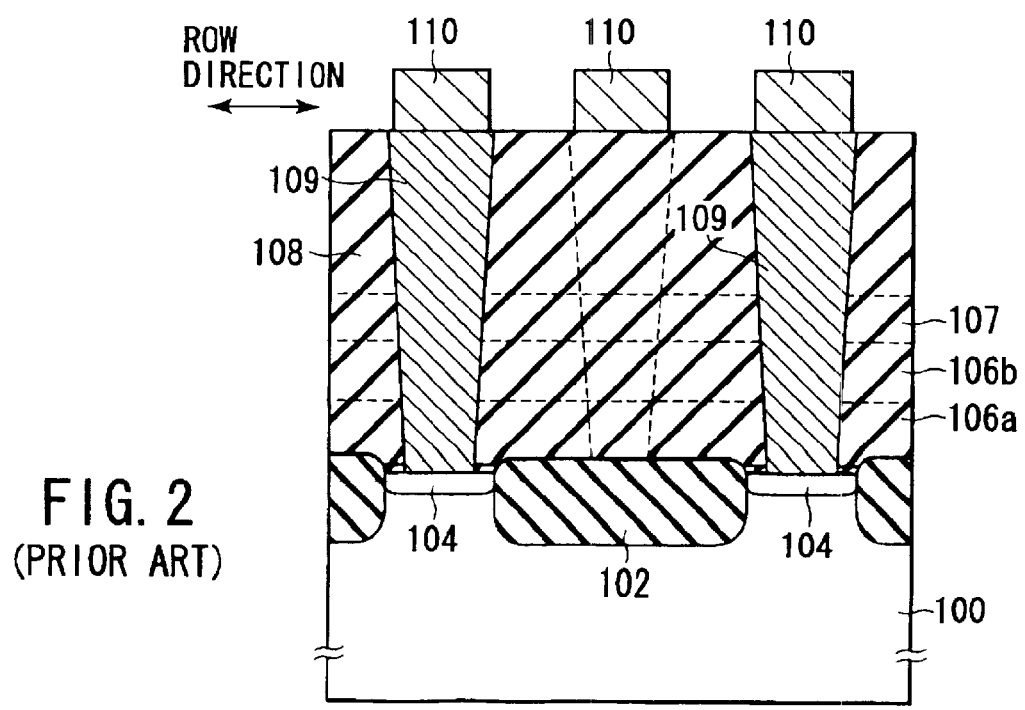
FIG. 2 is a cross-sectional view taken along a line II—II of FIG. 1.
Figure 3:
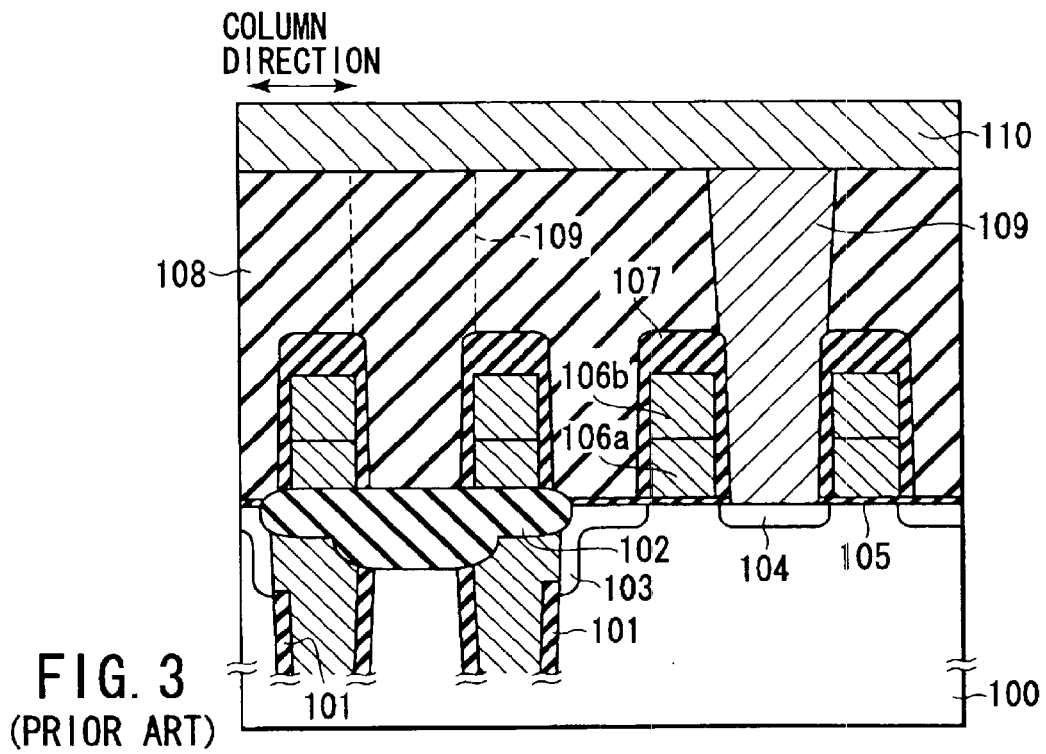
FIG. 3 is a cross-sectional view taken along a line III—III of FIG. 1.

In this embodiment, a memory cell array comprises array-like arranged plural trench capacitor type memory cells, correspondingly to the conventional example (FIG. 1, FIG. 2 and FIG. 3).

In a semiconductor substrate 100, a trench capacitor 101 is formed therein. The internal structure of the semiconductor substrate 100 and the structure of the trench capacitor 101 are not so important here; therefore, the details are omitted.

A surface region of the semiconductor substrate 100 is formed with a cell transistor. The cell transistor is composed of a source diffusion layer 103, a drain diffusion layer 104 and gate electrodes 106a and 106b. The source diffusion layer 103 is electrically connected to the trench capacitor 101. On the other hand, the drain diffusion layer 104 is connected to a bit line 110a via a contact plug 109a.

A gate insulating layer 105 is interposed between the gate electrodes 106a, 106b and the semiconductor substrate 100. The gate electrodes 106a and 106b comprises laminated first polysilicon layer 106a and second polysilicon layer 106b, respectively. Further, the gate electrodes 106a and 106b are covered with a silicon nitride layer 107.

An insulating layer 108 is formed on the cell transistor so as to fully cover the cell transistor. The insulating layer 108 is formed with a contact hole, which reaches the drain diffusion layer 104 of the cell transistor. The above contact plug 109a is arranged in the contact hold thus formed. Further, the contact plug 109a is made of conductive polysilicon, tungsten and the like.

A plurality of bit lines 101a and 110b extending to a column direction is formed on the insulating layer 108. The plurality of bit lines 110a and 110b is regularly laid out with a line and space pattern. An insulating layer 113 is further formed on the insulating layer 108 so as to cover the plurality of bit lines 101a and 110b.

In this case, the constituent features of the device structure of the present invention are the plurality of bit lines 101a and 110b. That is, the bit line 110b is formed at a position lower than the bit line 110a. Moreover, the bit lines 110a and 110b are alternately arranged. A width of the bit line 110a is set to the maximum size practicable by lithography technology. On the other hand, a width of the bit line 110b is set to substantially the same size as that of the bit line 110a.

The bit line 110a is simultaneously formed by lithography using one mask; at this time, a ratio of the width L and the space of the bit line 110a is set to 1 (minimum size): X. In this case, X is a numeral exceeding 1, and is set to 1.5, for example. Actually, X is set to a value less than 3. When X is 3, finally, the ratio of the width to the space of the bit line becomes 1:1 because it becomes the same as the conventional case.

In this embodiment, a side face of the bit line 110a is formed with a side wall 112; on the other hand, a side face of the bit line 110b contacts with the formed side wall 112. When a width of the side wall 112 is set as S, the ratio of the width L and the space S of the bit line 110a in forming the bit line 110a is set to L: L+2S.

Here, when layout is made so that the ratio becomes L=4S, the ratio of the width L and the space of the bit line 110a is L: L+2S=L: L+L/2=1:1.5.

Therefore, in the device structure of this embodiment, it is possible to form the bit line 110b by self-alignment, as described later.

More specifically, in the device structure, the bit line 110b is arranged at a position lower than the bit line 110a, and in the case where the line width of the bit line 110a is set to the minimum size practicable by lithography, the space of the bit line 110a is set to a value (e.g., 1.5 times) exceeding the minimum size.

Further, the bit line 110b is interposed between the bit lines 110a, and the side face of the bit line 110b contacts with the side wall 112. That is, when the width of the side wall 112 is set as S, the width of the bit line 110b becomes equal to a value subtracting (S×2) from the space of the bit line 110a.

In this case, the space between the bit lines 110a and 110b becomes equal to the width S of the side wall 112. The width S is sufficiently smaller than the minimum size (e.g., L) practicable by lithography.

As described above, according to the device structure of the present invention, first, the width of the bit lines 110a and 11b is widened, and thereby, it is possible to realize a high-speed operation by the reduction of interconnection resistance.

Namely, in the conventional case, when a predetermined number of bit lines are arranged in a predetermined region, the reduction of the space between the bit lines is limited by lithography performance. For this reason, it is impossible to widen the interconnection width of the bit line; as a result, this hinders the above high-speed operation by the reduction of interconnection resistance.

On the contrary, according to the present invention, in the case where a predetermined number of bit lines are arranged in a predetermined region like the conventional case, the space between the bit lines is not limited by lithography performance, and is adjustable by the width of the side wall. Thus, the space between the bit lines is made narrower than the minimum size practicable by lithography; conversely, the interconnection width of the bit line is widened, and thereby, it is possible to realize a high-speed operation by the reduction of interconnection resistance.

Secondary, a linear distance between adjacent bit lines is made substantially long, and thereby, it is possible to realize a high-speed operation by the reduction of interconnection capacitance.

Namely, in the conventional case, all bit lines are formed on the insulating layer (the same interconnection layer) having a flat surface. For this reason, the side faces of the adjacent bit lines fully face each other, and the interconnection capacitance becomes large; as a result, this hinders a high-speed operation.

On the contrary, according to the present invention, in the case of seeing the semiconductor substrate from the top, the space between adjacent bit lines is equal to the width of the side wall. However, in this case, the adjacent bit lines are arranged at the height (level) position different from each other. Thus, the side faces of the adjacent bit lines do not fully face each other, and the linear distance between the adjacent bit lines becomes substantially long. Therefore, the interconnection capacitance becomes small, and thereby, it is possible to realize a high-speed operation.

[Process]

Next, the following is a description of a manufacturing method of a semiconductor device according to one embodiment of the present invention.

In this embodiment, the semiconductor device shown in FIG. 4, FIG. 5 and FIG. 6 is given as an object.

First, a trench capacitor is formed in the semiconductor substrate using methods such as PEP (Photo Engraving Process), RIE (Reactive Ion Etching) and CVD (Chemical Vapor Deposition). The manufacturing method of the trench capacitor is not so important here; therefore, the details are omitted.

Figure 7:
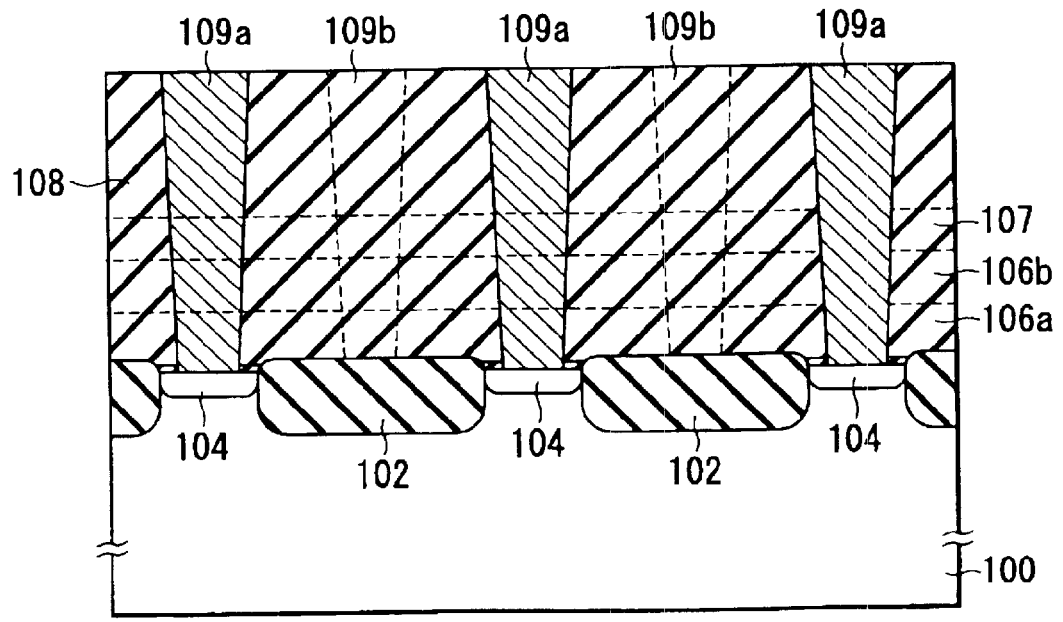
FIG. 7 is a cross-sectional view showing one step of a manufacturing method of the cell array section of a DRAM according to one embodiment of the present invention.

Subsequently, as shown in FIG. 7, an isolated layer 102 having an STI (Shallow Trench Isolation) structure is formed in the semiconductor substrate using methods such as PEP, CVD and CMP (Chemical Mechanical Etching), for example.

Moreover, a gate insulating layer 105 is formed on the semiconductor substrate 100 by a thermal oxidation method, and thereafter, conductive polysilicon layers 106a and 106b are formed on the gate insulating layer 105 by the CVD method. Thereafter, the conductive polysilicon layers 106a and 106b are processed using the PEP and RIE so that a gate electrode of cell transistor can be formed.

Further, ion implantation is carried out using the gate electrode of cell transistor as a mask so that a source diffusion layer and a drain diffusion layer 104 can be formed in the semiconductor substrate 100. Subsequently, the gate electrode of cell transistor is covered with a silicon nitride layer 107, and thereafter, an insulating layer 108 is formed. The surface of the insulating layer 108 is planarized by the methods such as CMP.

Thereafter, the insulating layer 108 is formed with a contact hole, which reaches the drain diffusion layer 104. Further, the conductive polysilicon layer is filled (deposited) in the contact hole by the CVD method so that contact plugs 109a and 109b can be formed. The conductive polysilicon layer is polished by the CMP so that the surface can be substantially flush with the surface of the insulating layer 108.

Figure 8:
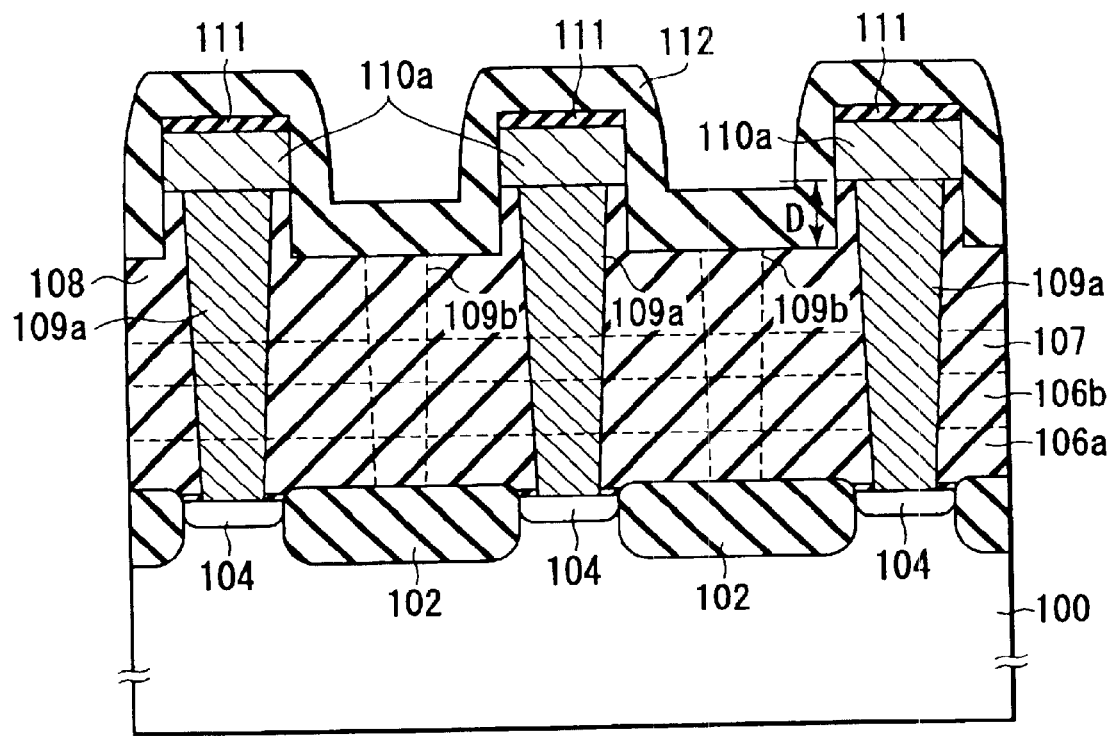
FIG. 8 is a cross-sectional view showing one step of a manufacturing method of the cell array section of a DRAM according to one embodiment of the present invention.

Subsequently, as shown in FIG. 8, for example, a conductive layer 110a and a silicon nitride layer 111 are formed on the insulating layer 108 by the CVD method. Then, the conductive layer 110a and a silicon nitride layer 111 thus formed are etched by PEP and RIE so that a bit line 110a can be formed. The formed bit line 110a contacts with the contact plug 109a, and does not contact with the contact plug 109b.

Here, the ratio of the width to the space of the bit line 110a is set to 1:X (1<X<), as described before.

Subsequently, the insulating layer 108 is etched by a predetermined amount (depth) using the silicon nitride layer 111 as a mask so that a trench (recess) can be formed. In this case, the etching amount becomes equal to a height of a stepped portion formed at the insulating layer 108. The stepped portion makes a vertically positional shift between the bit line 110a and a bit line 110b (see FIG. 12) described later. At this time, the contact plug 109b is also etched simultaneously.

Thereafter, for example, an insulating layer 112 is formed so as to cover the bit line 110a. The thickness of the formed insulating layer 112 is set to S as described before. The insulating layer 112 adheres to both of the side face of the bit line 110a and the stepped portion (trench) of the insulating layer 108.

Figure 9:
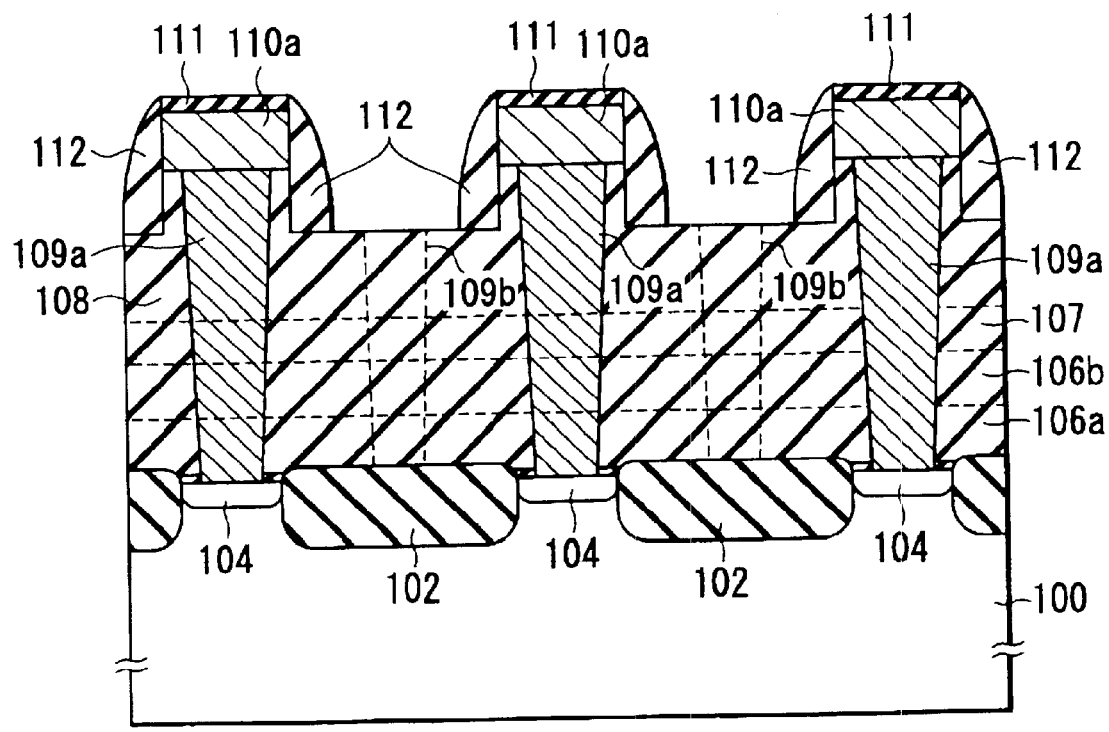
FIG. 9 is a cross-sectional view showing one step of a manufacturing method of the cell array section of a DRAM according to one embodiment of the present invention.

Subsequently, as shown in FIG. 9, the insulating layer 112 is etched by RIE so that a side wall 112 having a width S can be formed at the side face of the bit line 110a. According to the above etching, simultaneously, the contact plug 109b is exposed at the bottom portion of the trench of the insulating layer 108.

Figure 10:
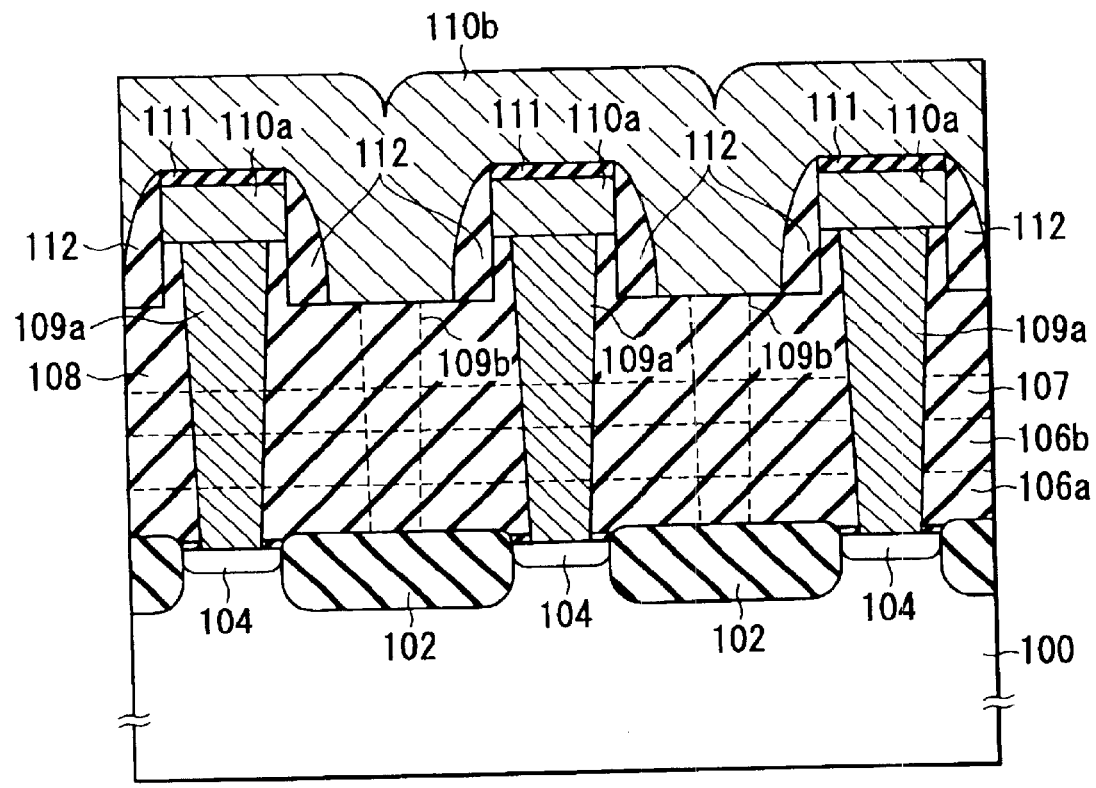
FIG. 10 is a cross-sectional view showing one step of a manufacturing method of the cell array section of a DRAM according to one embodiment of the present invention.

Subsequently, as shown in FIG. 10, a conductive layer 110b is formed using the CVD method so that the trench of the insulating layer 108 can be filled. In this case, it is preferable that the conductive layer 110b is made of the same material as the above conductive layer 110a.

Figure 11:
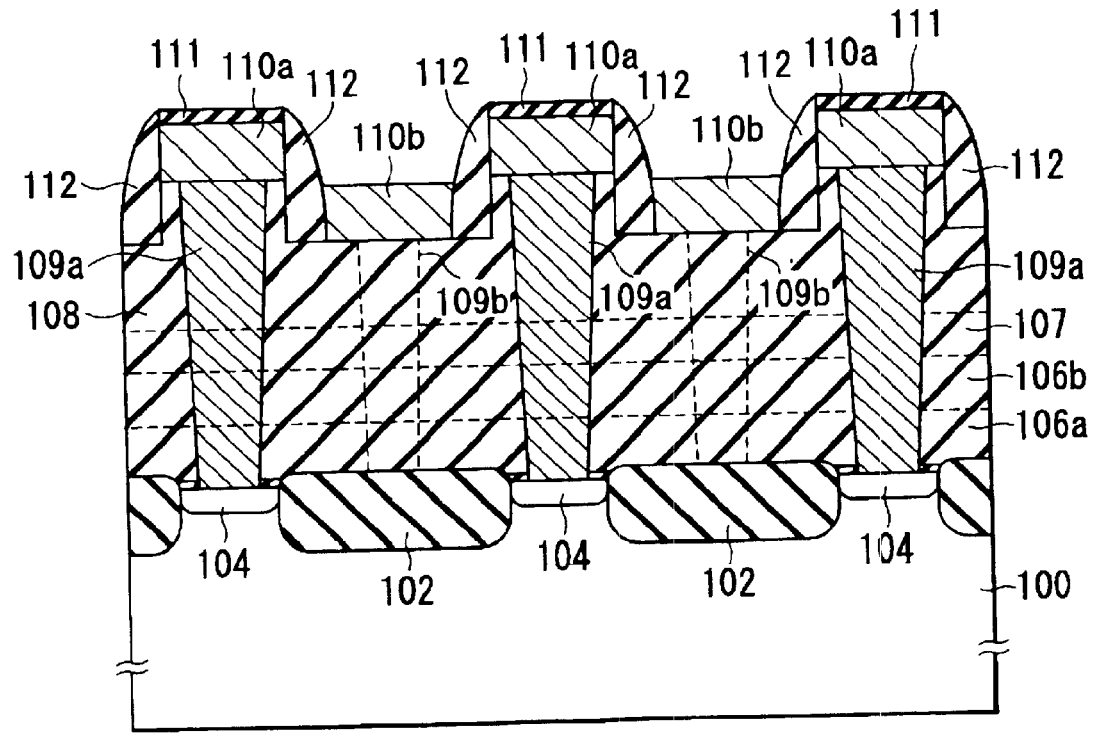
FIG. 11 is a cross-sectional view showing one step of a manufacturing method of the cell array section of a DRAM according to one embodiment of the present invention.

Subsequently, as shown in FIG. 11, the conductive layer 110b is polished or etched back so that a bit line 110b can be formed in the trench of the insulating layer 108. As described before, in the case where the width of the bit line 110a is set to L, it is preferable that the width of the bit line 110b is set to L. In this case, the thickness (corresponding to the above polished or etched back amount) of the bit line 110b is set equally to the thickness of the bit line 110a.

In this case, even if the width and thickness of the bit line 110a is not the same as those of the bit line 110b, a cross-sectional area of the bit line 110a is set substantially to the same as that of the bit line 110b, and thereby, there is no problem in memory characteristics.

Figure 12:
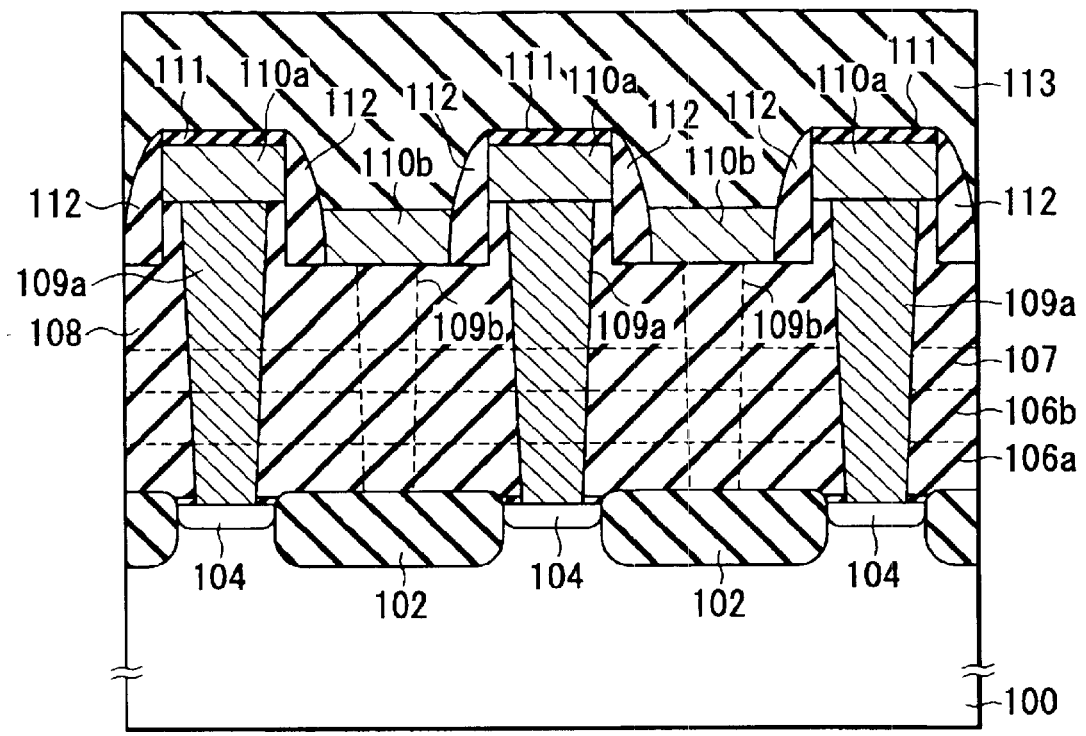
FIG. 12 is a cross-sectional view showing one step of a manufacturing method of the cell array section of a DRAM according to one embodiment of the present invention.

Subsequently, as shown in FIG. 12, an insulating layer 113 is formed by the CVD method so as to cover the bit lines 110a and 110b.

According to the above manufacturing method, the bit line 110a is formed, and thereafter, the bit line 110b can be formed between the bit lines 110a by the above self-alignment. Further, the space between the bit lines 110a and 110b is equal to the width S of the side wall 112; therefore, there is no influence by the limit of lithography technology.

Therefore, the individual widths of the bit lines 110a and 110b are widened, and thereby, it is possible to realize a high-speed operation by the reduction of interconnection resistance.

Moreover, the bit line 110a is subjected to patterning, and thereafter, the insulating layer 108 is etched so that the trench can be formed in the insulating layer 108. Then, since the bit line 110b is formed in the trench, the side faces of the bit lines 110a and 110b do not fully face each other; therefore, the linear distance of the bit lines 110a and 110b becomes substantially long.

Therefore, it is possible to realize a high-speed operation by the reduction of interconnection capacitance.

As described above, according to the semiconductor device of the present invention and the manufacturing method of the same, it is possible to solve the problems of the interconnection capacitance and the interconnection resistance arisen by the miniaturization of the semiconductor device (or design rule). In particular, it is possible to solve the above problems from device structure and process aspects, and not from the material aspect.

[Modification Examples]

Figure 13:
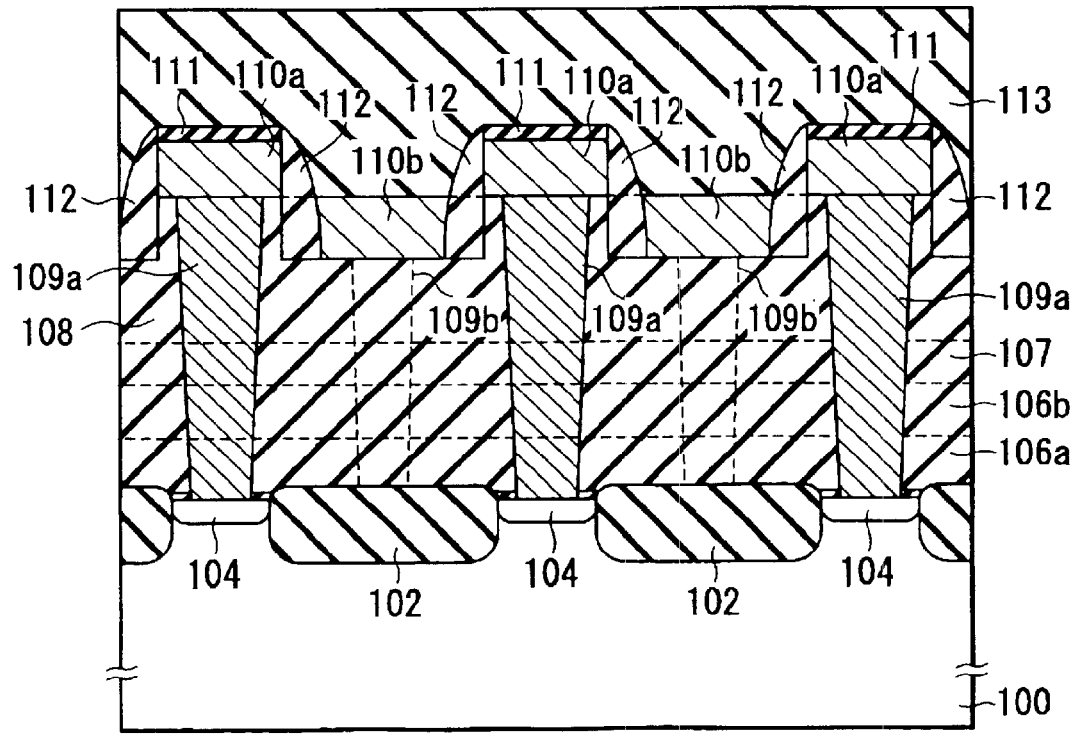
FIG. 13 is a cross-sectional view showing a modification example of the present invention.
Figure 14:
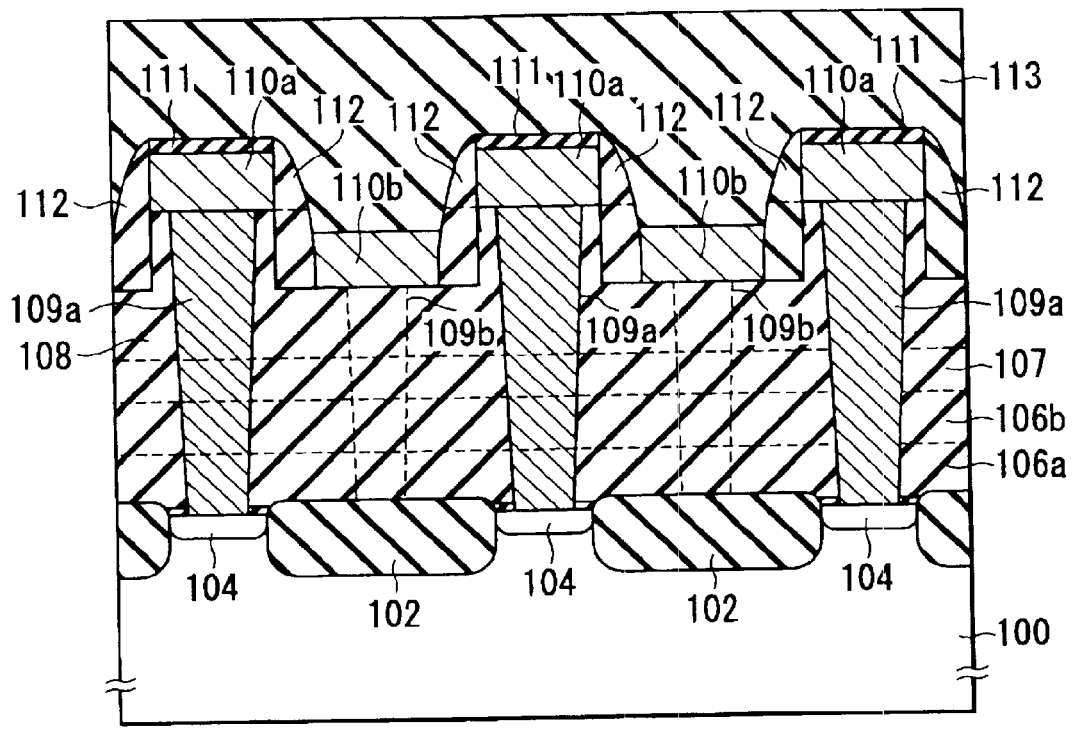
FIG. 14 is a cross-sectional view showing another modification example of the present invention.
Figure 15:
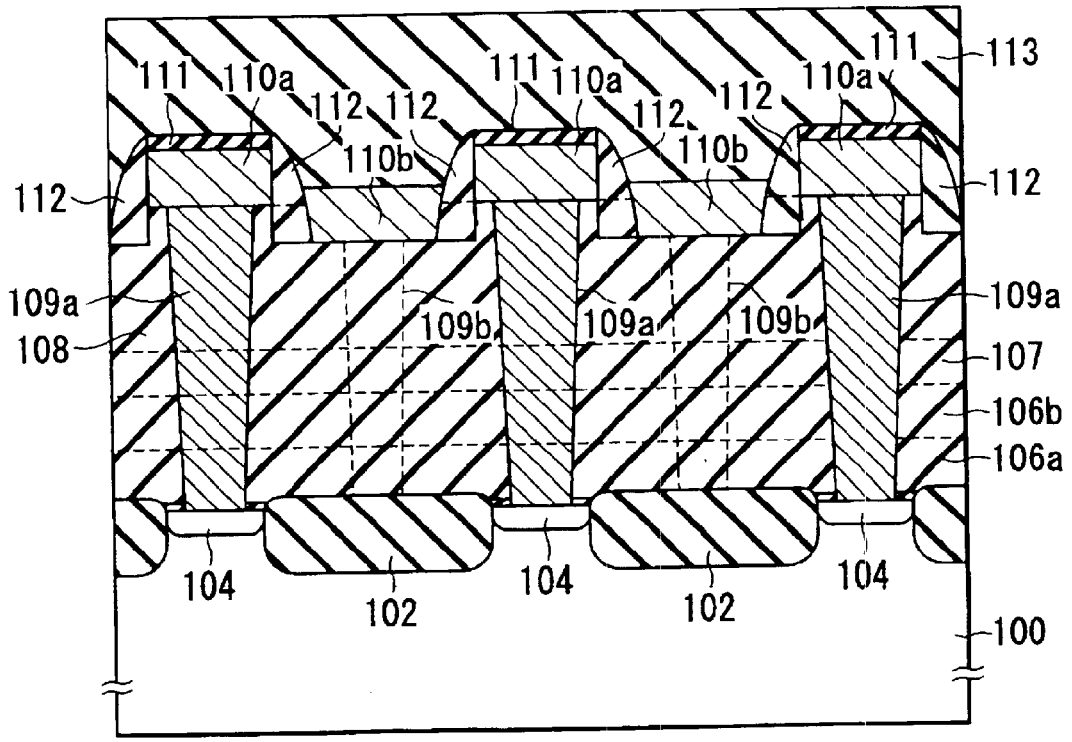
FIG. 15 is a cross-sectional view showing another modification example of the present invention.

FIG. 13 to FIG. 15 shows a positional relation between the bit line 110a formed by lithography and the bit line 110b formed by self-alignment.

In the modification example shown in FIG. 13, the bottom surface of the bit line 110a is substantially flush with the upper surface of the bit line 110b. Each width of the bit lines 110a and 110b is set to the same value, and also, each thickness of the bit lines 110a and 110b is set to the same value. In this case, the depth of the trench formed in the insulating layer 108 becomes substantially equal to the thickness of the bit line 110a.

In the modification example shown in FIG. 14, the bottom surface of the bit line 110a exists at the position higher than the upper surface of the bit line 110b. Each width of the bit lines 110a and 110b is set to the same value, and also, each thickness of the bit lines 110a and 110b is set to the same value. In this case, the depth of the trench formed in the insulating layer 108 becomes larger than the thickness of the bit line 110a.

In this modification example, the distance between the bit lines 110a and 110b becomes long as compared with the modification example shown in FIG. 13; therefore, this can contribute for a reduction of the interconnection capacitance.

In the modification example shown in FIG. 15, the bottom surface of the bit line 110a exists at the position lower than the upper surface of the bit line 110b. Each width of the bit lines 110a and 110b is set to the same value, and also, each thickness of the bit lines 110a and 110b is set to the same value. In this case, the depth of the trench formed in the insulating layer 108 becomes smaller than the thickness of the bit line 110a.

In this modification example, the difference in the stepped portion formed between the bit lines 110a and 110b becomes small, as compared with the modification example shown in FIG. 13. Therefore, the contact hole between the bit line 110a and the semiconductor substrate can be prevented from having a high aspect ratio.

[Application Examples]

FIG. 16 to FIG. 19 shows an interconnection layout of the boundary portion between a cell array section and a peripheral circuit section.

The device structure of the present invention has the following features as described before. That is, the bit line 110b is formed between the bit lines 110a by self-alignment, and the bit line 110b is formed at the position lower than the bit line 110a.

In this case, for example, an interconnection pattern of the peripheral circuit section is formed at the same time when the bit line 110a is formed by lithography. That is, the bit line 110a and an interconnection of the peripheral circuit section are formed at the identical level; however, the bit line 110b is formed at the position lower than the interconnection of the peripheral circuit section.

Figure 16:
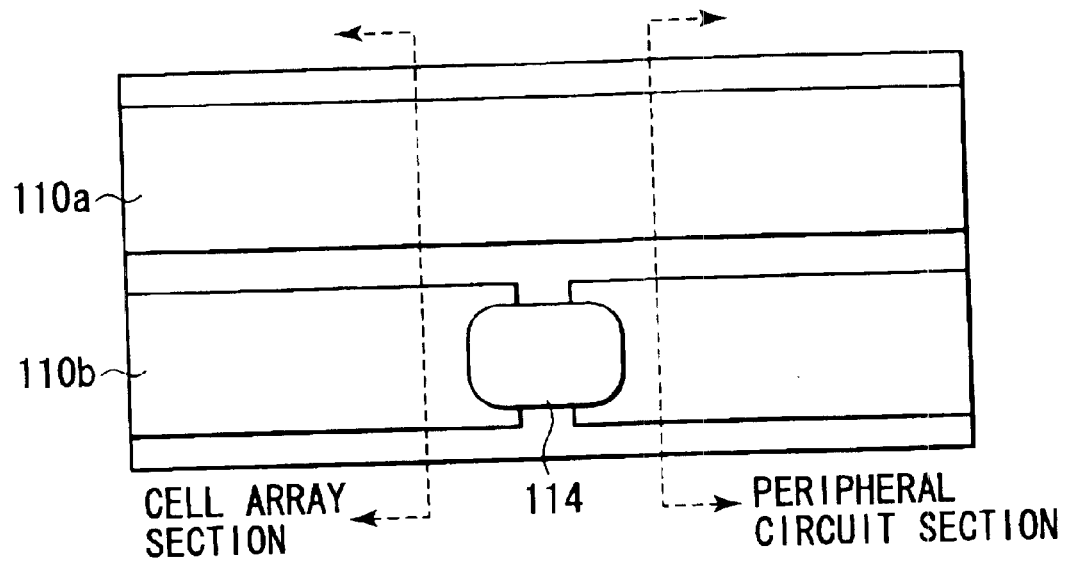
FIG. 16 is a top plan view showing one example of a boundary portion between the cell array section and a peripheral circuit section.
Figure 17:
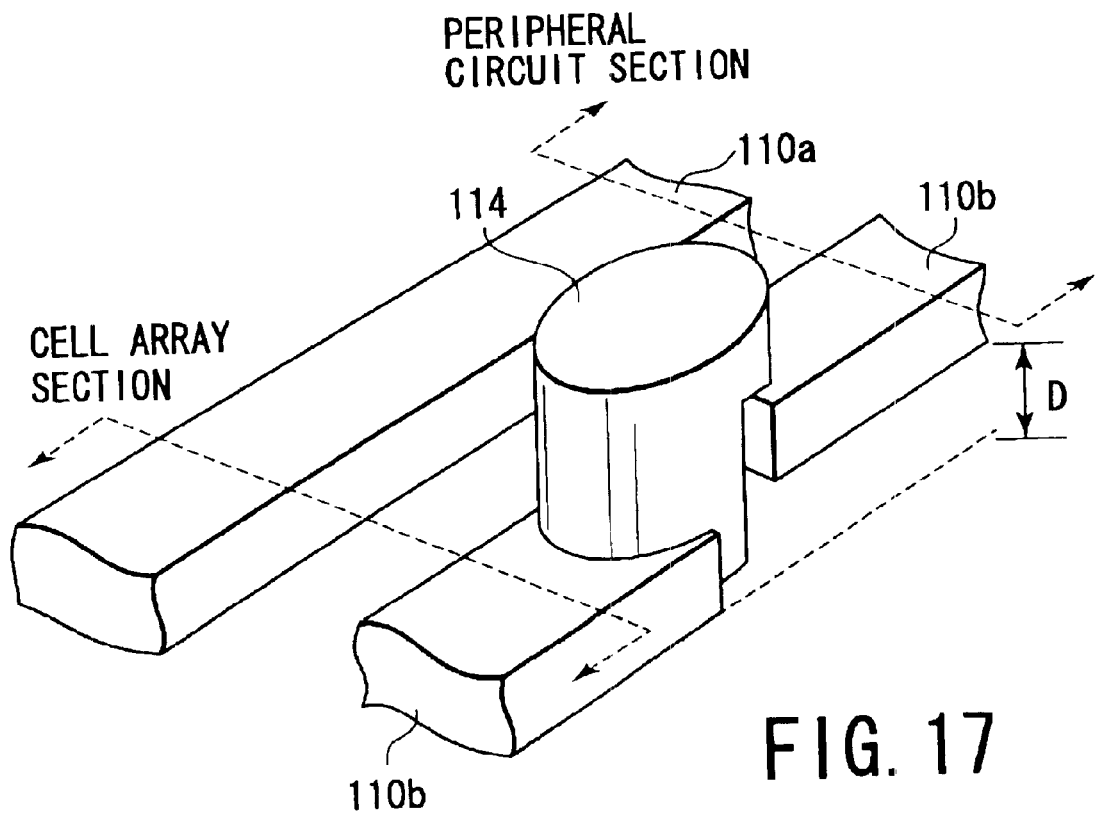
FIG. 17 is a top plan view showing another example of a boundary portion between the cell array section and a peripheral circuit section.

For example, as shown in FIG. 16 and FIG. 17, a contact plug 114 is formed at the boundary portion between the cell array section and the peripheral circuit section so that the bit line 110b and the interconnection line of the peripheral circuit section can be electrically connected with each other using the contact plug 114.

Further, in the example as shown in FIG. 16 and FIG. 17, the contact plug 114 is connected to only bit line 110b. For this reason, the interconnection resistance of the bit lines 110a and 110b largely varies; as a result, the operation becomes unstable.

Figure 18:
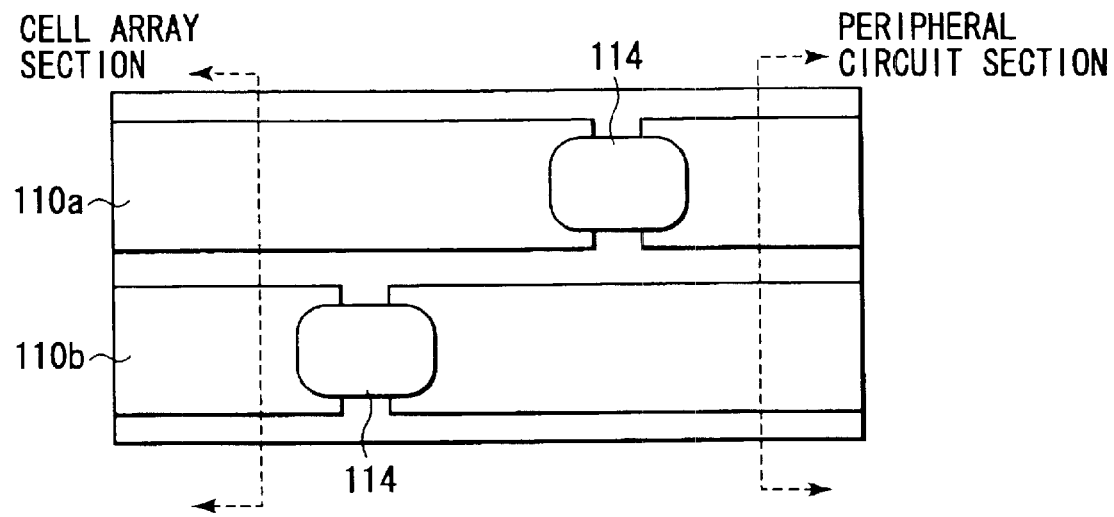
FIG. 18 is a top plan view showing another example of a boundary portion between the cell array section and a peripheral circuit section.
Figure 19:
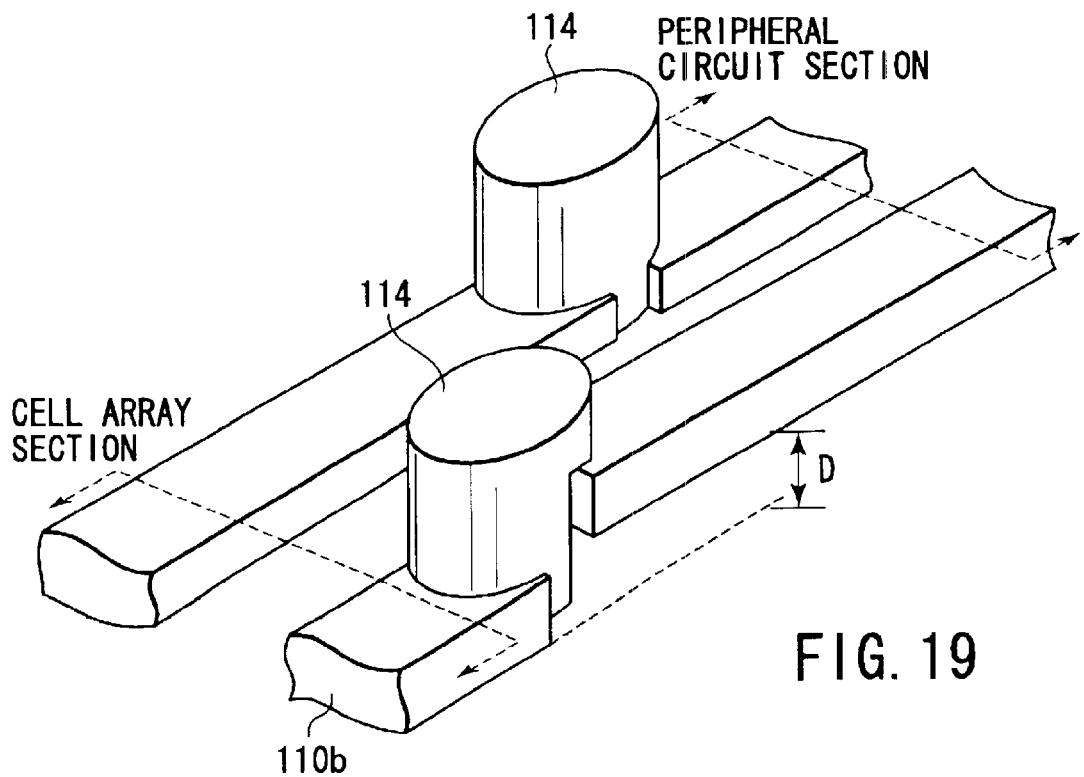
FIG. 19 is a top plan view showing another example of a boundary portion between the cell array section and a peripheral circuit section.

In order to prevent the above disadvantage, for example, as shown in FIG. 18 and FIG. 19, the bit line 110a is formed with a slit (or notch) at the boundary portion between the cell array section and the peripheral circuit section, and the contact plug 114 is formed on the slit. In this case, since the contact plug 114 is connected with both of the bit lines 110a and 110b, the interconnection resistance of the bit line 110a becomes substantially the same as that of the bit line 110b; therefore, the operation is stable.

Incidentally, in the case where the contact plug 114 connected to the bit line 110a and the contact plug 114 connected to the bit line 110b are arranged on the identical line, it is difficult to carry out lithography. For this reason, as shown in FIG. 18 and FIG. 19, it is preferable that the contact plugs 114 are arranged in a state of shifting in the position of the interconnection length direction (e.g., in a zigzagged state).

As is evident from the above description, according to the semiconductor device of the present invention and the manufacturing method of the same, the insulating layer just under the plural bit lines is formed with the stepped portion (trench), and one part of the plural bit lines is formed at the upper stage; another part thereof (e.g., every other line) is formed at the lower stage (in the trench) by self-alignment. By doing so, the width of the bit line is made large in a predetermined region, and the linear distance between the bit lines is set longer in the predetermined region. Accordingly, it is possible to solve the problems of the interconnection capacitance and the interconnection resistance arisen by the miniaturization of the semiconductor device (or design rule). In particular, it is possible to solve the above problems from device structure and process aspects, and not from the material aspect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulating layer having a surface shape comprising a concave portion and a convex portion;
   a first interconnection line arranged on the convex portion of the insulating layer;
   a side wall arranged on a side face of the first interconnection line and on a side face of the concave portion of the insulating layer; and
   a second interconnection line arranged in the concave portion of the insulating layer, and contacting with the side wall, wherein the first and second interconnection lines extend in one direction.

2. The semiconductor device according to claim 1, wherein the first and second interconnection lines are made of the identical material, and used for the identical purpose.

3. The semiconductor device according to claim 2, wherein the first and second interconnection lines are bit lines.

4. The semiconductor device according to claim 1, wherein a space between the first and second interconnection lines is equal to a width of the side wall.

5. The semiconductor device according to claim 1, wherein a cross-sectional area of the first interconnection lines is equal to that of the second interconnection line.

6. The semiconductor device according to claim 1, wherein an end portion of the second interconnection line extending to one direction is electrically connected to a third interconnection line by a first contact plug.

7. The semiconductor device according to claim 6, wherein an end portion of the first interconnection line extending to one direction is electrically connected to a fourth interconnection line by a second contact plug.

8. The semiconductor device according to claim 7, wherein the first and second contact plugs are mutually shifted in position in one direction.

9. The semiconductor device according to claim 7, wherein the first and second interconnection lines are arranged in a cell array section, and the third and fourth interconnection lines are arranged in a peripheral circuit section.

10. A semiconductor device comprising:
    an insulating layer;
    a first interconnection line arranged on the insulating layer;
    a side wall arranged on a side face of the first interconnection line; and
    a second interconnection line arranged on the insulating layer, and contacting with the side wall, wherein the first and second interconnection lines extend in one direction, wherein an end portion of the second interconnection line extending to one direction is electrically connected to a third interconnection line by a first contact plug.

11. The semiconductor device according to claim 10, wherein the first and second interconnection lines are made of the identical material, and used for the identical purpose.

12. The semiconductor device according to claim 11, wherein the first and second interconnection lines are bit lines.

13. The semiconductor device according to claim 10, wherein a space between the first and second interconnection lines is equal to a width of the side wall.

14. The semiconductor device according to claim 10, wherein a cross-sectional area of the first interconnection lines is equal to that of the second interconnection line.

15. The semiconductor device according to claim 10, wherein an end portion of the first interconnection line extending to one direction is electrically connected to a fourth interconnection line by a second contact plug.

16. The semiconductor device according to claim 15, wherein the first and second contact plugs are mutually shifted in position in one direction.

17. The semiconductor device according to claim 15, wherein the first and second interconnection lines are arranged in a cell array section, and the third and fourth interconnection lines are arranged in a peripheral circuit section.

* * * * *